United States Patent [19]

Blair

[11] 4,321,073

[45] Mar. 23, 1982

[54] METHOD AND APPARATUS FOR FORMING METAL COATING ON GLASS FIBER

[75] Inventor: George R. Blair, Culver City, Calif.

[73] Assignee: Hughes Aircraft Company, Culver City, Calif.

[21] Appl. No.: 197,367

[22] Filed: Oct. 15, 1980

[51] Int. Cl.³ ............................................. C03C 25/02
[52] U.S. Cl. ..................................... 65/3.31; 65/11.1; 118/50.1; 427/126.2; 427/252; 427/253; 427/255
[58] Field of Search .............................. 65/3.31, 11.1; 118/50.1, 65; 427/126.2, 166, 252, 253, 255

[56] References Cited

U.S. PATENT DOCUMENTS

| | | |
|---|---|---|
| 2,900,274 | 8/1959 | Whitehurst . |
| 2,938,821 | 5/1960 | Nack . |
| 2,958,899 | 11/1960 | Stein et al. ............... 65/3.31 X |
| 2,979,424 | 4/1961 | Whitehurst et al. . |
| 2,980,956 | 4/1961 | Whitehurst et al. . |
| 3,019,515 | 2/1962 | Whitehurst et al. . |
| 3,083,550 | 4/1963 | Averbach . |
| 3,097,941 | 7/1963 | Toulmin, Jr. . |
| 3,347,208 | 10/1967 | Arridge . |
| 3,356,527 | 12/1967 | Moshier et al. . |
| 3,650,598 | 3/1972 | Kitano et al. . |
| 3,806,224 | 4/1974 | MacChesney et al. . |

Primary Examiner—Robert L. Lindsay, Jr.
Attorney, Agent, or Firm—David W. Collins; W. H. MacAllister

[57] ABSTRACT

Glass fibers employed as optical waveguides are provided with a metal coating by passing the glass fiber, following its formation, through a chamber into which a metal-containing compound is introduced. A source of radiant energy, e.g., a $CO_2$ laser, is introduced by means that are controllably positioned from the glass fiber, e.g., an infrared-transmitting fiber such as thallium bromo-iodide. The radiant energy is sufficient to cause dissociation of the metal-containing compound on the glass fiber surface so as to form the metal coating on the glass fiber without coating the rest of the apparatus. Any metal compound may be used such as metal carbonyls, metal halides, metal alkyls, metal aryls, metal olefins, metal esters, metal nitro compounds, metal hydrides and combinations and mixtures thereof.

9 Claims, 2 Drawing Figures

METHOD AND APPARATUS FOR FORMING METAL COATING ON GLASS FIBER

BACKGROUND OF THE INVENTION

1. Field of the Invention

This invention relates to forming metal coatings on glass fibers employed as optical waveguides, and more particularly, to employing laser heating of the glass fiber to deposit the metal by dissociation of a metal-containing compound, thereby coating only the glass fiber.

2. Description of the Invention

The deposition of metal to coat glass fibers is done for a variety of purposes. Often, the metal deposition is done as an aid to strengthening the fiber, or at least maintaining the strength of the fiber, for use in composite applications. In the case of glass fibers employed in optical communications and data links, the metal coating may additionally provide a metallic conduction path for electrical signals.

Deposition of metal coatings on glass fibers has been done from the solid phase (see, e.g., U.S. Pat. No. 3,650,598), from aqueous solution (see, e.g., U.S. Pat. Nos. 3,019,515, 2,979,424 and 2,900,274), from molten metal (see, e.g., U.S. Pat. Nos. 3,347,208 and 2,980,956) and from the vapor phase (see, e.g., U.S. Pat. Nos. 3,806,224, 3,097,941, 3,083,550 and 2,938,821). In vapor phase deposition, metal-containing compounds have been variously employed, in which the ligand is a carbonyl, halide, alkyl, aryl, olefin, ester, nitro compound, hydride and mixtures of these. In general, however, deposition of metal from such vapor phase has required passing the glass fiber to be coated through a chamber, introducing the metal-containing compound into the chamber and dissociating the metal-containing compound to form the metal plus a gaseous product. Dissociation is commonly carried out by heating the metal-containing compound to its dissociation point. In most instances, this has necessitated heating the entire structure (chamber, susceptor, gas phase, etc.) through which the glass fiber is passing. The deposition of metal thus occurs over all heated surfaces, including the walls of the chamber through which the glass fiber is being passed as well as the fiber itself. Such extraneous deposition is, of course, wasteful of material.

SUMMARY OF THE INVENTION

In accordance with the invention, apparatus and process for coating a glass fiber are provided. The apparatus for providing a metal coating on a glass fiber comprises:

(a) a chamber adapted to permit passage therethrough of the glass fiber;

(b) means for introducing into the chamber a metal-containing compound capable of dissociation to form elemental metal and a gaseous product;

(c) a source of radiant energy having a wavelength in a range sufficient to heat at least the surface of the glass fiber to a temperature capable of dissociating the metal-containing compound;

(d) means for introducing the radiant energy to at least a portion of only the glass fiber in the chamber; and (e) means for removing any non-dissociated compound and gaseous product.

The process for coating the glass fiber with a metal comprises:

(a) passing the glass fiber through a chamber;

(b) introducing into the chamber a metal-containing compound capable of dissociation to form elemental metal and gaseous product;

(c) heating only the glass fiber to a temperature sufficient to cause dissociation of the metal-containing compound and deposition of elemental metal on the glass fiber;

(d) removing any non-dissociated compound and a gaseous product; and (e) recovering metal-coated glass fiber. Only the glass fiber passing through the chamber is coated with the metal formed by dissociation of the metal-containing compound. As a consequence, heating requirements are minimized and the metal-containing compound is more efficiently utilized.

DETAILED DESCRIPTION OF THE INVENTION

Figure 1:
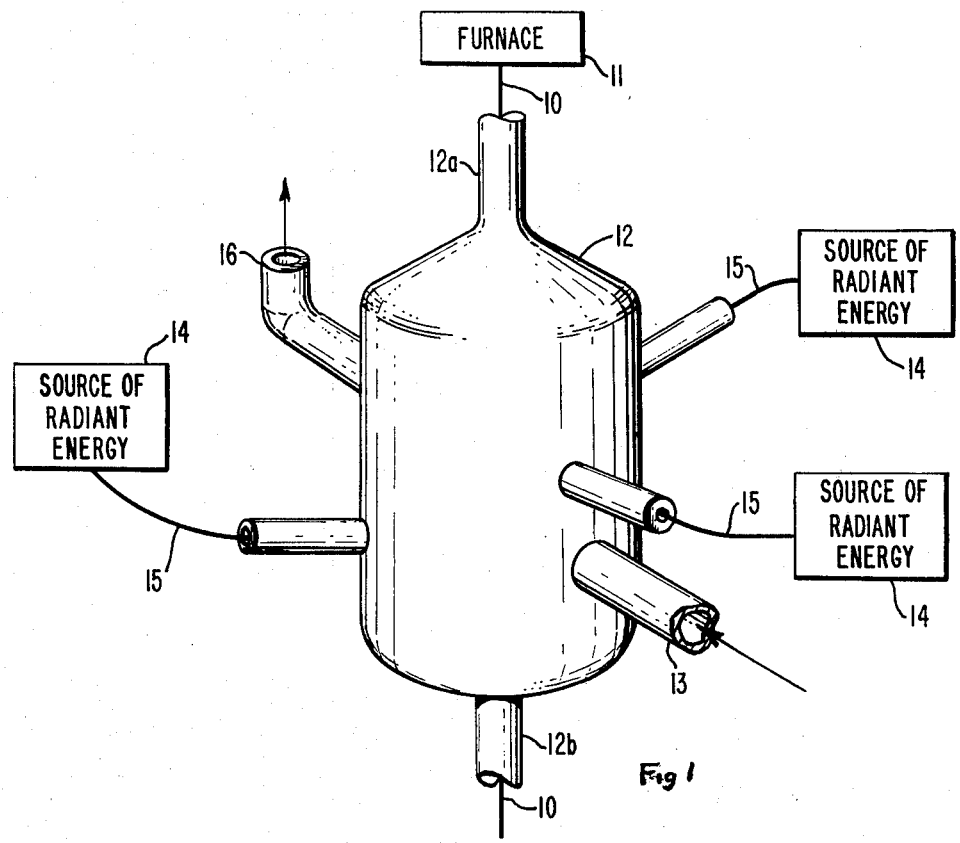
FIG. 1 depicts an example of apparatus suitable in the practice of the invention.
Figure 2:
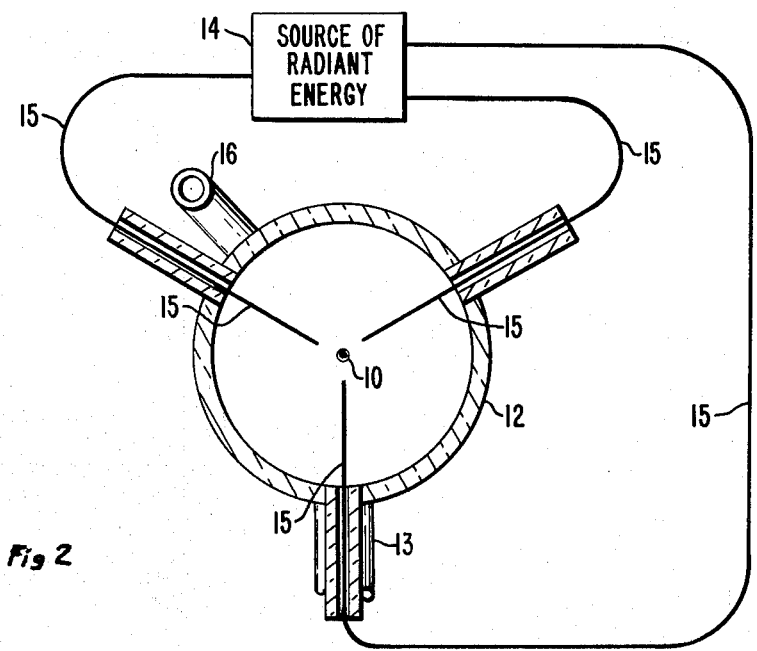
FIG. 2 is a cross-sectional view of the apparatus of FIG. 1.

Apparatus suitable in the practice of the invention is depicted in the FIGS. 1 and 2. The apparatus is useful for providing a metal coating on a glass fiber 10 as it emerges from a furnace 11. Furnaces for producing glass fibers for optical communications are well-known in the prior art and do not form a part of this invention. The glass fiber passes through a heating zone or chamber 12 which surrounds the fiber and provides a space into which a metal-containing compound in the vapor state is introduced. The metal-containing compound is one that is capable of dissociation to form elemental metal and gaseous product. Means 13 is provided for introducing the metal-containing compound into the chamber. A source 14 of radiant energy is used to provide heat to the glass fiber surface sufficient to cause dissociation of the metal-containing compound. The radiant energy emitted by source 14 is introduced to a portion of only the glass fiber by means 15, which comprises at least one fiber capable of transmitting the radiant energy. Means 16 is provided for removal of gaseous dissociation products and any metal-containing compound not dissociated. The metal-coated glass fiber emerges from heating chamber 12 and is recovered by winding on a take-up drum (not shown).

The chamber is conveniently a glass chamber having an entrance 12a and an exit 12b to permit passage therethrough of the glass fiber to be metal coated. The chamber is maintained in-line between the furnace producing the glass fiber and the take-up drum for recovering the metal-coated glass fiber. A gas seal conveniently isolates the glass fiber in the chamber from the ambient, thus avoiding physical contact of the glass fiber.

Any metal-containing compound capable of dissociating to form elemental metal and gaseous product may be used in the practice of the invention. Examples include metal carbonyls such as iron carbonyl, molybedenum carbonyl, nickel carbonyl, chromium carbonyl, tungsten carbonyl and cobalt carbonyl; metal halides such as chromium chloride, tungsten chloride, molybdenum chloride, aluminum chloride, aluminum bromide, aluminum iodide, cobalt bromide, cobalt chloride, ferric chloride, germanium bromide, germanium chloride, manganese fluoride, chromium fluoride, nickel bromide, nickel chloride, tin bromide, tin chloride, tin fluoride and titanium chloride; metal alkyls such as aluminum diisobutyl, aluminum triisobutyl and aluminum triethyl; metal aryls such as chromium dibenzene, molybdenum dibenzene, molybdenum ditoluene, vanadium dibenzene and vanadium di-mesitylene diiodide; metal olefins such as the bis-cyclopentadienyls of iron (ferrocene), manganese, cobalt (cobaltocene), nickel (nickelocene), rhodium and vanadium; esters such as the $\beta$-diketonates (acetylacetonates) of copper, manganese, titanium, platinum and nickel, dibutyl tin formate, copper formate and copper acetate; nitro compounds such as copper nitroxyl and cobalt nitrosyl carbonyl; hydrides such as antimony hydride; and combinations and mixtures thereof such as alkyl and aryl compounds including benzene chromium tricarbonyl, phenanthrene chromium tricarbonyl, naphthalene chromium tricarbonyl, o-xylene chromium tricarbonyl, benzene molybdenum tricarbonyl, cyclo-octadiene molybdenum tricarbonyl; bis-cyclopentadienyl chlorides, bromides and diiodides of titanium, zirconium, hafnium, vanadium, molybdenum, tungsten and tantalum; cyclopentadienyl carbonyls such as cyclopentadienyl manganese tricarbonyl, bis-cyclopentadienyl carbonyls of molybdenum, tungsten and iron; and carbonyl halogens such as ruthenium carbonyl chloride. For ease of dissociation, the $\beta$-diketonates, especially the fluorinated $\beta$-diketonates such as cupric hexafluoroacetyl acetonate and cupric trifluoroacetyl acetonate, are preferred. The organic ligand resulting from the dissociation of the metal diketonate is usually recovered for future use.

The metal-containing compound may be introduced into the chamber in several ways. If in vapor form, it may be introduced directly as a flowing gas stream. Alternately, it may be diluted with an inert gas such as nitrogen or with a reducing gas such as hydrogen or forming gas (85% $N_2$–15% $H_2$) to improve efficient utilization of the dissociated metal and to prevent oxidation of the metal during the deposition process. Preferably, a mildly reducing gas, e.g., forming gas, is employed. Use of a hydrogen-containing gas stream (at least about 5% $H_2$) is desirable if recycling of the organic ligand is contemplated. If the metal-containing compound is in solid or liquid form, it may be entrained on a gas stream, as by passing the gas over the compound, or, in the case of a liquid, bubbling the gas therethrough. Again, an inert or a reducing gas is employed. The compound or the gas stream may be pre-heated somewhat to increase the vapor pressure of the metal-containing compound and thereby increase efficiency of entrainment.

Preferably, a carrier gas is employed, regardless of the physical state of the metal-containing compound; the carrier gas also functions as a gas seal at entrance 12a and exit 12b. Use of a gas seal avoids physical contact of the glass fiber with the seal, which would otherwise occur with a mechanical seal.

Since silica ($SiO_2$), the major constituent of the glass fiber, is transparent at wavelengths less than about 5 $\mu$m, the source of radiant energy 14 must emit radiation in a range that will be absorbed by the silica, which implies a wavelength greater than about 5 $\mu$m. A laser such as a $CO_2$ laser, which emits coherent radiation at 10.6 $\mu$m, is one suitable source of radiant energy. Other sources may also be used, providing the emission of radiant energy is in a range of wavelengths that will be absorbed by the $SiO_2$.

Use of sources of radiant energy operating at wavelengths greater than 5 $\mu$m requires use of fibers 15 that are transparent to such radiation; this, of course, precludes use of silica fibers. Suitable fibers for transmitting such IR radiation include thallium bromo-iodide (KRS-5).

At least one IR fiber 15 is adequate to provide a metal coating on the glass fiber. Preferably, a plurality of IR fibers is employed, to insure adequate control over uniformity of the metal coating. One efficient configuration is to stagger a plurality of IR fibers, spaced 120° around the glass fiber, in spiral fashion, such as depicted in FIGS. 1 and 2. Once the metal coating has begun to form, the dissociation process will continue because the metal absorbs enough radition to be maintained at a sufficient temperature to cause dissociation of additional metal-containing compound. A conventional optical divider may be employed to couple radiant energy from a single source 14 to a plurality of IR fibers 15.

The distance from the tip of the IR fiber 15 to the glass fiber 10 being coated ranges from about 1 to 6 mm. At a distance of less than about 1 mm, back radiation from the glass fiber to the IR fiber causes undesirable over-heating of the IR fiber. A distance of greater than about 6 mm result in too great a dispersal of the energy emitted from the end of the IR fiber, with consequent reduction in efficiency in dissociating the metal-containing compound.

For the sake of clarity, the glass fiber 10 and the IR fibers 15 are shown enlarged. Omitted are means for coupling the IR fibers to the chamber 14, means for adjusting the distance of the IR fibers from the glass fiber, and means for supporting the IR fibers over their length.

In the process of forming the metal coating on the optical fiber, the metal-containing vapor is introduced into the chamber, as described above, along with an inert gas or reducing gas in order to prevent oxidation of the metal during deposition. The chamber is heated to some convenient temperature to generate sufficient vapor pressure of the metal-containing compound, but not hot enough to cause decomposition. Under the influence of the radiant energy transmitted to the glass fiber, the fused silica fiber becomes hot enough to cause the metal-containing compound to dissociate to form elemental metal, which is deposited on the fused silica fiber, and a gaseous organic ligand, which may be recovered if sufficient hydrogen is present to react with the ligand and form the corresponding hydrogenated species.

No lenses or difficult optical alignment procedures are required for the practice of the invention. The metal will not deposit any place else, such as on the walls of the chamber, since all of the surfaces, other than that of the glass fiber, are below the dissociation temperature of the compound. The glass fiber can be passed through the radiant energy beam at a relatively rapid rate so that in-line coating is easily done as the glass fiber emerges from the drawing furnace. The metal coating formed in accordance with the invention provides a hermetic seal to the glass fiber. If desired, a simple converging lens may be hot pressed onto the end of the IR fiber for providing greater heating rates.

EXAMPLE

Apparatus similar to that depicted in the FIG. 1 was employed, except that one IR fiber was utilized. The metal-containing compound employed was cupric trifluoroacetyl acetonate, carried on forming gas (85% $N_2$-15% $H_2$) flowing at 1 to 2 l/min. The metal-containing compound was maintained at 160° C. The fiber was heated by absorption of energy having a wavelength of 10.6 μm provided by a 4-watt $CO_2$ laser to greater than 250° C. and probably less than 325° C. The IR fiber was 0.020 inch diameter thallium bromo-iodide mixed crystal (KRS-5). Input to the IR fiber was coupled from the laser by means of a germanium lens, with the IR fiber positioned by an X-Y-Z table to the exact focal point. Output from the IR fiber was a flat polished end of the fiber. The transmitted infrared radiation was allowed to diverge normally.

The glass fiber being metal coated consisted of a silica-germania-phosphoria core with a pure silica cladding. The distance between the end of the IR fiber and the optical fiber being coated ranged from about 0.040-0.060 inches (1.02 to 1.52 mm). The fiber was drawn through the chamber at a rate of about 3 in/sec.

The copper was deposited only on the glass fiber, as a shiny film opaque to visible light (about 2,000 to 3,000 A thick). The copper was deposited in about 1 to 2 seconds.

What is claimed is:

1. Apparatus for providing a metal coating on a glass fiber including silica as its major constituent comprising:
   (a) a chamber adapted to permit passing therethrough of said glass fiber;
   (b) means for introducing into said chamber a metal-containing compound capable of dissociation to form elemental metal and a gaseous product;
   (c) a source of radiant energy emitting radiation at a wavelength greater than about 5 μm to heat at least the surface of said glass fiber to a temperature capable of dissociating said metal-containing compound;
   (d) means for introducing said radiant energy to at least a portion of only said glass fiber in said chamber, said means comprising at least one infrared-transmitting fiber; and
   (e) means for removing any non-dissociated compound and gaseous product.

2. The apparatus of claim 1 in which said source of radiant energy comprises a $CO_2$ laser.

3. The apparatus of claim 1 in which said infrared-transmitting fiber comprises thallium bromo-iodide.

4. The apparatus of claim 1 in which the distance from the end of said infrared-transmitting glass fiber to said glass fiber ranges from about 1 to 6 mm.

5. A process for coating a glass fiber including silica as its major constituent with a metal comprising:
   (a) passing said glass fiber through a chamber;
   (b) introducing into said chamber a metal-containing compound capable of dissociation to form elemental metal and gaseous product;
   (c) heating only said glass fiber to a temperature sufficient to cause dissociation of said metal-containing compound and deposition of elemental metal on said glass fiber by exposing at least a portion of said glass fiber in said chamber to a source of radiant energy, said source of radiant energy emitting radiation at a wavelength greater than about 5 μm, said radiant energy being coupled to said glass fiber through at least one infrared transmitting fiber;
   (d) removing any non-dissociated compound and gaseous product; and
   (e) recovering metal-coated glass fiber.

6. The process of claim 5 in which said glass fiber is heated by a $CO_2$ laser.

7. The process of claim 6 in which said infrared transmitting fiber comprises thallium bromo-iodide.

8. The process of claim 5 in which said metal-containing compound consists essentially of at least one metal compound selected from the group consisting of metal carbonyls, metal halides, metal alkyls, metal aryls, metal olefins, metal esters, metal nitro compounds, metal hydrides and combinations and mixtures thereof.

9. The process of claim 8 in which said metal-containing compound consists essentially of a metal β-diketonate.

* * * * *